United States Patent [19]

Daniels et al.

[11] Patent Number: 5,206,116
[45] Date of Patent: Apr. 27, 1993

[54] LIGHT-SENSITIVE COMPOSITION FOR USE AS A SOLDERMASK AND PROCESS

[75] Inventors: George R. E. Daniels, Mattapan, Mass.; Michael J. Oddi, Springhill, Fla.; Kevin J. Cheetham, Milbury; Stephen S. Rodriguez, Monument Beach, both of Mass.

[73] Assignee: Shipley Company Inc., Newton, Mass.

[21] Appl. No.: 663,604

[22] Filed: Mar. 4, 1991

[51] Int. Cl.$^5$ .......................... G03F 7/16; G03F 7/30; G03F 7/38; G03F 7/40

[52] U.S. Cl. .................... 430/311; 430/315; 430/324; 430/330; 430/327; 430/935

[58] Field of Search ............... 430/315, 324, 311, 330, 430/327, 935

[56] References Cited

U.S. PATENT DOCUMENTS

| | | | |
|---|---|---|---|
| 3,697,274 | 10/1972 | Herrmann | 430/330 |
| 4,025,348 | 5/1977 | Tsukada et al. | 430/315 X |
| 4,064,287 | 12/1977 | Lipson et al. | 430/315 |
| 4,102,687 | 7/1978 | Crivello | 96/115 R |
| 4,230,793 | 10/1980 | Losert et al. | 430/315 |
| 4,256,828 | 3/1981 | Smith | 430/280 |
| 4,438,189 | 3/1984 | Geissler et al. | 430/330 |
| 4,439,517 | 3/1984 | Irving | 430/328 |
| 4,529,490 | 7/1985 | Crivello | 428/416 X |
| 4,581,321 | 4/1986 | Stahlhofen | 430/325 |
| 4,994,346 | 2/1991 | Meier et al. | 430/280 |
| 5,084,372 | 1/1992 | Hsieh et al. | 430/330 |

FOREIGN PATENT DOCUMENTS

| | | |
|---|---|---|
| 0232972 | 1/1987 | European Pat. Off. . |
| 0349803 | 6/1989 | European Pat. Off. . |
| 0423446 | 8/1990 | European Pat. Off. . |
| 0425418 | 9/1990 | European Pat. Off. . |
| 0462391 | 5/1991 | European Pat. Off. . |
| 55-129341 | 10/1980 | Japan . |
| 60-26943 | 2/1985 | Japan . |

*Primary Examiner*—Cynthia Hamilton
*Attorney, Agent, or Firm*—Robert L. Goldberg

[57] ABSTRACT

A light sensitive composition and process for using said composition. The light sensitive composition comprises a phenolic resin, a multifunctional epoxy or vinyl compound, a photoinitiator and a thermal crosslinking agent. The process for using the same comprises application of the light sensitive composition to a substrate, drying of the same, exposing the dried coating to activating radiation, partially heat curing the coating, developing the coating and thermally curing the developed image. The composition is especially useful as a solder mask.

11 Claims, No Drawings

LIGHT-SENSITIVE COMPOSITION FOR USE AS A SOLDERMASK AND PROCESS

BACKGROUND OF THE INVENTION

1. Introduction

This invention relates to light-sensitive compositions and more particularly, to light-sensitive compositions useful as solder resists in the manufacture of printed circuit boards.

2. Description of the Prior Art

For years, screen printing was the means used to apply a soldermask to a substrate in the manufacture of printed circuit boards. It was a desired process because it permitted selection of masking materials from a variety of resins in the formulation of the soldermask and enabled one to apply a heavy coating on an uneven surface with a reasonable degree of accuracy. However, increased packing of conductor tracks and reduced track widths resulted in a demand for greater dimensional accuracy and resolution of features beyond the resolution capability of conventional screen printing masks.

The accuracy and fine line definition capability of photoimagable systems has long been known, but photoimagable systems was initially not applied to the soldermask problem to obtain improved accuracy and line resolution.

A first step towards the formulation of a photoimagable soldermask was the introduction of screen printed U.V. photopolymerizable soldermasks utilizing acrylate resins. However, such photopolymerizable soldermasks did not gain significant market share.

A next step in the evolution of soldermasks was the introduction of the photoimagable soldermask analogous to the photoimagable photoresists used in printed circuit board manufacture to define a desired conductor pattern. Two primary methods were used to apply photoimagable soldermasks to a circuit substrate. One was as a dry film soldermask using a laminator to apply heat and pressure to the soldermask as it was applied to the circuit board substrate. The other method used a liquid soldermask curtain coated onto a substrate. Both dry film soldermask and curtain coated soldermask had advantages and disadvantages. Disadvantages common to both include use of organic solvent development, poor to moderate adhesion to copper and an industry desire for an increased resistance to elevated temperatures. The use of organic solvents presents environmental problems. Poor adhesion to copper results in delamination of the mask from the copper conductors during the soldering operation. Inadequate thermal resistance results in deformation of the mask during soldering.

More recently, aqueous developable liquid soldermask compositions have been developed in an effort to avoid the use of organic solvent developers. These soldermasks are generally applied as a wet coating, such as by curtain coating, dried, exposed, partially cured using heat and developed, typically with an aqueous alkaline solution and then fully cured by baking. An example of such a soldermask is disclosed in European patent publication No. 0,255,989. The soldermask of the published application consists of at least one solid film-forming phenolic resin, a compound that contains at least two epoxy groups or two vinyl groups or one of each in the molecule and a cationic photoinitiator such as a sulfonium salt.

As is known in the art, a soldermask must possess certain properties. It must adhere firmly to the underlying substrate, must resist degradation at soldering temperature, must have resistance to processing chemicals and must possess suitable dielectric properties. Moreover, if the soldermask is to be a photoimagable soldermask, the system must provide adequate image resolution.

Screen soldermasks were readily formulated to provide soldermasks with suitable properties because resin formulations could be prepared that were not required to be compatible with imaging chemicals. The selection of resins for formation of photoimagable soldermasks was curtailed because many resins used in soldermask formulations are not suitable in a photoimagable system. Provision for an aqueous developable soldermask further curtailed the availability of resins because portions of the soldermask must be soluble in an aqueous developer.

Where selection of resins for an aqueous developable soldermask is limited, difficulties have been encountered in efforts to provide an aqueous developable soldermask coating having properties comparable to the properties of a screened soldermask. In particular, dried coatings formed from aqueous developable soldermasks have been found to exhibit reduced adhesion to copper at elevated temperatures, poor thermal properties and poor resistance to processing chemicals such as fluxes.

SUMMARY OF THE INVENTION

The subject invention is for an improved photoimagable, aqueous developable, coating composition suitable for use as a soldermask having properties superior to those of other aqueous developable soldermasks of similar composition. The invention is based in part on the discovery that the soldermask should contain a relatively high concentration of certain melamine based curing agents in addition to a photoinitiator and in use of the soldermask composition, a thermal cure step should follow development to crosslink remaining active sites and adhesively bond the soldermask to underlying copper.

In general, the photoimagable composition of the invention comprises a phenolic resin, preferably a phenol formaldehyde novolak resin or a polyvinyl phenol resin, a compound containing at least two active groups selected from the group consisting of epoxy groups and vinyl groups, a photoinitiator and a melamine based thermal curing agent. The photoimagable coating composition of the invention is suitable for use either as a liquid coating composition or in the form of a dry film and is used in conventional manner.

A dry film formed from the photoimagable composition of the invention is characterized by superior properties, especially enhanced adhesion to underlying metals, resistance to degradation at the elevated temperatures required for soldering operations, resistance to aggressive chemicals such as flux cleaners and is developable in aqueous alkaline developer solutions thus avoiding the need for organic solvent developers. In addition, another unexpected property arising from the use of the melamine curing agent is enhanced developability of an imaged coating. This is unexpected because a crosslinking agent would be expected to make development more difficult. Further, because of excellent dielectric properties and resistance to thermal degradation, the coatings of the invention may be used as permanent dielectric coatings.

DESCRIPTION OF THE PREFERRED EMBODIMENTS

The phenolic resin, for purposes of the invention, is a film-forming resin with phenolic hydroxyl groups permitting development in an aqueous alkaline solution. Exemplary phenolic resins include, for example, phenol aldehyde condensates known in the art as the novolak resins, homo and copolymers of alkenyl phenols and homo and copolymers of N-hydroxyphenyl-maleimides.

Of the phenolic resins suitable for purposes of the invention, the phenol formaldehyde novolaks are more preferred as these materials are known for the ability to form light sensitive coatings known to be aqueous developable. These resins are made following procedures well known in the art and disclosed in numerous publications such as by DeForest, *Photoresist Materials and Processes*, McGraw-Hill Book Company, New York, Ch. 2, 1975 and by Moreau, *Semiconductor Lithography Principles, Practices and Materials*, Plenum Press, New York, Chs. 2 and 4, 1988, both incorporated herein by reference. Novolak resins are the thermoplastic condensation product of a phenol and an aldehyde. Examples of suitable phenols for condensation with an aldehyde, especially formaldehyde, for the formation of novolak resins, include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in the formation of a suitable novolak resin which may vary in molecular weight from about 500 to 100,000 daltons. The preferred novolak resins are the cresol formaldehyde condensation products.

Polyvinyl phenol resins are thermoplastic resins that may be formed by block polymerization, emulsion polymerization or solution polymerization of corresponding monomers in the presence of a cationic catalyst. Vinyl phenols used for production of polyvinyl phenol resins may be prepared, for example, by hydrolysis of commercially available coumarins or substituted coumarins, followed by decarboxylation of the resulting hydroxy cinnamic acids. Useful vinyl phenols may also be prepared by dehydration of the corresponding hydroxy alkyl phenol or by decarboxylation of hydroxy cinnamic acids resulting from the reaction of substituted or non-substituted hydroxy benzaldehydes with malonic acid. Preferred polyvinyl phenol resins prepared from such vinyl phenols have a molecular weight range of from about 2,000 to about 60,000 daltons. Procedures for the formation of polyvinyl phenol resins can be found in U.S. Pat. No. 4,439,516 incorporated herein by reference.

An additional, though lesser preferred, class of phenolic resins for purposes of the present invention include homo and copolymers of N-hydroxyphenyl maleimides. Such materials are disclosed in the above-cited European published application 0,255,989 beginning on page 2, line 45 and continuing to page 5, line 51, incorporated herein by reference for its teaching of such resins.

The second component of the light sensitive composition of the invention is a material capable of crosslinking with a phenolic resin through an acid catalyzed condensation reaction. This material is one having at least two epoxy groups, two vinyl groups or one epoxy group and one vinyl group.

Epoxy containing materials are any organic compounds having an oxirane ring polymerizable by ring opening. Such materials, broadly called epoxies, include monomeric epoxy compounds, and polymeric epoxides that may be aliphatic, cyloaliphatic, aromatic or heterocyclic. Suitable materials generally, on average, have at least 2 polymerizable epoxy groups per molecule. The polymeric epoxides include linear polymers having terminal epoxy groups (e.g. a diglycidyl ether of a polyoxyalkylene glycol), polymers having skeletal oxirane units (e.g. polybutadiene polyepoxide), and polymers having pendent epoxy groups (e.g. a glycidyl methacrylate polymer or copolymer). The epoxides may be pure compounds but are generally mixtures containing one, two or more epoxy groups per molecule. The average number of epoxy groups per molecule is determined by dividing the total number of epoxy groups in the epoxy-containing material by the total number of epoxy molecules present.

Useful epoxy-containing materials may vary from low molecular weight monomeric materials to high molecular weight polymers and may vary greatly in the nature of their backbone and substituent groups. For example, the backbone may be of any type and substituent groups may be any group free of an active hydrogen atom reactive with an oxirane ring at room temperature. Illustrative of suitable substituents include halogens, ester groups, ethers, sulfonate groups, siloxane groups, nitro groups, phosphate groups, etc.

Further epoxy containing materials useful in the practice of this invention include glycidyl ethers. Examples are the glycidyl ethers of polyhydric phenols obtained by reacting a polyhydric phenol with an excess of chlorohydrin such as epichlorohydrin (e.g. the diglycidyl ether of 2,2-bis(2,3-epoxy-propoxyphenol)propane). Further examples of epoxides of this type are described in U.S. Pat. No. 3,018,262, incorporated herein by reference.

There are many commercially available epoxy containing materials which can be used in this invention. In particular, epoxides which are readily available include epichlorohydrin, glycidol, glycidylmethacrylate, the glycidyl ether of p-tertiarybutylphenol (e.g. those available under the trade designation "Epi-Rez" 5014 from Celanese); diglycidyl ether of Bisphenol A (e.g. those available under the trade designations "Epon 828," "Epon 1004" and "Epon 1010" from Shell Chemical Co., "DER-331," "DER-332" and "DER-334," from Dow Chemical Co.), vinylcyclohexene dioxide (e.g. "ERL-4206" from Union Carbide Corp.), 3,4-epoxy-6-methyl-cyclohexylmethyl-3,4-epoxy-6-methylcyclohexene carboxylate (e.g. "ERL-4201" from Union Carbide Corp.), bis(3,4-epoxy-6-methylcy- clohexylmethyl) adipate (e.g. "ERL-4289" from Union Carbide Corp.), bis(2,3-epoxycyclopentyl) ether (e.g. "ERL-0400" from Union Carbide Corp.), aliphatic epoxy modified with polypropylene glycol (e.g. "ERL-4050" and "ERL-4052" from Union Carbide Corp.), dipentene dioxide (e.g. "ERL-4269" from Union Carbide Corp.), epoxidized polybutadiene (e.g. "Oxiron 2001" from FMC Corp.), flame retardant epoxy resins (e.g. "DER-580," a brominated bisphenol type epoxy resin available from Dow Chemical Co.), 1,4-butanediol diglycidyl ether of phenolformaldehyde novolak (e.g. "DEN-431" and "DEN-438" from Dow Chemical co.), and resorcinol diglycidyl ether (e.g. "Kopoxite" from Koppers Company, Inc.).

Examples of compounds with at least two vinyl ether groups include divinyl ethers of aliphatic, cycloaliphatic, aromatic or araliphatic dioles. Examples of such materials include divinyl ethers of aliphatic dioles having from 1 to 12 carbon atoms, polyethylene glycols, propylene glycols, polybutylene glycols, dimethylcyclohexanes, etc. Specific examples include divinyl ethers of ethylne glycol, trimethylene-1,3,- diole, diethylene glycol, triethylene glycol, dipropylene glycol, tripropylene glycol, resorcinol, Bisphenol A, etc.

The compositions of the invention also contain a photoinitiator which photodecomposes upon exposure to activating radiation releasing a Lewis acid that causes reaction between the phenolic resin and epoxy or vinyl ether compound upon exposure to heat in the light-exposed areas. Photoinitiators useful in the compositions of the invention are known in the art, extensively described in the literature such as U.S. Pat. No. 4,090,936 incorporated herein by reference and are generally selected from onium salts of a Group VA element, onium salts of a Group VI A element, and aromatic halonium salts. These complex salts, upon being exposed to ultraviolet radiation or electron beam irradiation, are capable of generating moieties which initiate epoxide reactions.

Preferred photoinitiators include aromatic iodonium complex salts and aromatic sulfonium complex salts. The aromatic iodonium complex salts are of the formula:

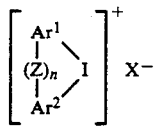

where Ar$^1$ and Ar$^2$ are aromatic groups having 4 to 20 carbon atoms and are selected from the group consisting of phenyl, thienyl, furanyl, and pyrazolyl groups: Z is selected from the group consisting of oxygen; sulfur;

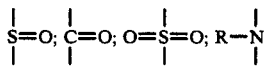

where R is aryl (of 6 to 20 carbons, such as phenyl) or acyl (of 2 to 20 carbons, such as acetyl, benzoyl, etc.); a carbon-to-carbon bond; or

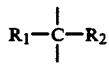

where $R_1$ and $R_2$ are selected from hydrogen, alkyl radicals of 1 to 4 carbons, and alkenyl radicals of 2 to 4 carbons; and n is zero or 1; and wherein X$^-$ is a halogen-containing complex anion selected, for example, from tetrafluoroborate, hexafluorophosphate, hexafluoroarsenate, and hexafluoroantimonate.

Suitable examples of the aromatic iodonium complex salt photoinitiators include diphenyliodonium tetrafluoroborate, phenyl-4-methylphenyliodonium tetrafluoroborate, di(3-nitrophenyl)iodonium hexafluorophosphate, di(naphthyl)iodonium tetrafluoroborate, diphenyliodonium hexafluorophosphate, diphenyliodonium hexafluoroarsenate, phenyl-2-thienyliodonium hexafluorophosphate, diphenyliodonium hexafluoroantimonate, di(2,4-dichlorophenyl)iodonium hexafluorophosphate, di(4-methoxyphenyl)iodonium hexafluorophosphate and di(3-methoxycarbonylphenyl)iodonium hexafluorophosphate, di(4-acetamidophenyl)iodonium hexafluorophosphate.

Of the aromatic iodonium complexes, the preferred salts are the diaryliodonium hexafluorophosphate and the diaryliodonium hexafluoroantimonate.

Sulfonium complex salt photoinitiators suitable for use in the compositions of the invention are preferably defined by the formula

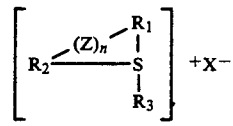

wherein $R_1$, $R_2$, and $R_3$ can be the same or different, provided that at least one of such groups is aromatic, and such groups can be selected from aromatic groups having 4 to 20 carbon atoms (e.g. substituted and unsubstituted phenyl, thienyl, and furanyl) and alkyl radicals having 1 to 20 carbon atoms. The term "alkyl" as used here is meant to include substituted alkyl radicals (for example, substituents such as halogen, hydroxy, alkoxy, aryl). Preferably, $R_1$, $R_2$ and $R_3$ are each aromatic. Z is selected from the group consisting of oxygen; sulfur;

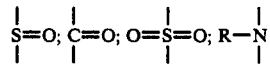

where R is aryl (of 6 to 20 carbons, such as phenyl) or acyl (of 2 to 20 carbons, such as acetyl, benzoyl, etc.); a carbon to carbon bond; or

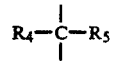

where $R_4$ and $R_5$ are selected from the group consisting of hydrogen, an alkyl radical having 1 to 4 carbon atoms, and an alkenyl radical having 2 to 4 carbon atoms; and n is 0 or 1; and X$^-$ is a halogen-containing complex anion selected, for example, from the group consisting of tetrafluoroborate, hexafluorophosphate, hexafluoroarsenate, and hexafluorophosphate.

Aromatic sulfonium salts are known and recognized in the art. They are substituted with at least one, and preferably three, aromatic groups. Representative groups are aromatic groups having 4 to 20 carbon atoms and are selected from phenyl, thienyl and furanyl groups. These aromatic groups may optionally have one or more fused benzo rings (e.g. naphthyl and the like; benzothienyl, dibenzothienyl; benzofuranyl, dibenzofuranyl; etc.). Such aromatic groups may also be substituted if desired by one or more of the following non-basic groups which are essentially non-reactive with epoxide and hydroxy: halogen, nitro, aryl, ester groups (e.g. alkoxycarbonyl such as methoxycarbonyl and ethoxycarbonyl, phenoxycarbonyl and acyloxy such as acetoxy and propionyloxy), sulfo ester groups (e.g. alkoxysulfonyl such as methoxysulfonyl and butoxysulfonyl, phenoxysulfonyl, and the like), amido groups (e.g. acetamido, butyramido, ethylsulfonamido, and the like), carbamyl groups (e.g. carbamyl, N-alkylcarbamyl, N-phenylcarbamyl, and the like), sulfamyl groups (e.g. sulfamyl, N-alkylsulfamyl, N,N-dialkylsulfamyl, N-phenylsulfamyl, and the like), alkoxy groups (e.g. methoxy, ethoxy, butoxy, and the like), aryl groups (e.g. phenyl), alkyl groups (e.g. Methyl, ethyl, butyl, and the like) aryloxy groups (e.g. phenoxy), alkylsulfonyl (e.g. methylsulfonyl, ethylsulfonyl, and the like), arylsulfonyl groups (e.g. phenylsulfonyl groups), perfluoroalkyl groups (e.g. trifluoromethyl, perfluoroethyl, and the like), and perfluoroalkylsulfonyl groups (e.g. trifluoromethylsulfonyl, perfluorobutylsulfonyl, and the like).

Examples of suitable aromatic sulfonium complex salt photoinitiators include triphenylsulfonium tetrafluoroborate, dimethylphenylsulfonium hexafluorophosphate, tritolysulfonium hexafluorophosphate, 4-butoxyphenyldiphenylsulfonium tetrafluoroborate, tris(4-phenoxyphenyl)sulfonium hexafluorophosphate, 4-acetoxyphenyldiphenylsulfonium tetrafluoroborate, tris(4-thiomethoxyphenyl)sulfonium hexafluorophosphate, di(methoxynaphthyl)methylsulfonium tetrafluoroborate, dimethylnaphthylsulfonium hexafluorophosphate and phenylmethylbenxylsulfonium hexafluorophosphate.

Of the aromatic sulfonium complex salts which are suitable for use in the compositions of the invention, triaryl substituted salts such as triphenylsulfonium hexafluorophosphate are preferred.

An additional major component of the photoimageable composition of this invention is a melamine formaldehyde thermal crosslinking agent. Melamine formaldehdye resins are amino resins formed by condensation of formaldehyde with melamine. The resins are typically ethers such as trialkylol melamine and hexaalkylol melamine. The alkyl group may have from 1 to as many as 8 or more carbon atoms but is preferably methyl. Dependent upon the reaction conditions and the concentration of formaldehyde, the methyl ethers may react with each other to form more complex units.

Melamine resins are known in the art, commercially available from American Cyanamid Company of Wayne, N.J. under the trade name Cymel and described in American Cyanimid's product bulletin *High Solids Amino Crosslinking Agents,* published in 1984 as Bulletin No. 4-2111 5K7/84. In accordance with this invention, the preferred melamine formaldehyde resin has a degree of polymerization varying between 1.3 and 2.0 and most preferably, is a member of the Cymel 300 Resin series which are highly methylated melamine formaldehyde resins. The most preferred melamine formaldehyde resin for purposes of this invention is Cymel 301 which is a hexamethoxymethyl melamine with a low methylol content having alkoxy groups as the principle reactive groups and a degree of polymerization of 1.5.

As is well known in the art, other optional additives may be included in compositions of the type disclosed herein such as dyes, fillers, wetting agents, fire retardants and the like. Sensitizers constitute a preferred additive for purposes of the invention and are added to the composition to increase wavelength photosensitivity, thereby increasing photospeed and decreasing cure time. Suitable sensitizers include 2-ethyl-9,10-dimethoxyanthracene, 9,10-dichloroanthracene, 9,10-phenylanthracene, 1-chloroanthracene, 2-methylanthracene, 9-methylanthracene, 2-t-butyl anthracene, anthracene, 1,2-benzanthracene, 1,2,3,4-dibenzanthracene, 1,2,5,6-dibenzanthracene, 1,2,7,8-dibenzanthracene, 9,10-dimethoxydimethylanthracene, and the like. The preferred sensitizer is 2-ethyl-9,10-dimethoxyanthracene.

To make a liquid coating composition, the components of the soldermask are dissolved in a suitable solvent such as, for example, one or more of the glycol ethers such as ethylene glycol monomethyl ether, ethylene glycol monoethyl ether; esters such as a methyl cellosolve acetate, ethyl cellosolve acetate, propylene glycol monomethyl ether acetate, dipropylene glycol monomethyl ether acetate and other solvents such as dibasic esters, propylene carbonate and gamma-butaryl lactone.

The concentration of the components of the photoimageable composition of the invention may vary within wide limits dependent upon the use of the material. Concentration ranges for the principal ingredients of the formulation are set forth in the following table and expressed as dry solids in parts by weight.

|  | Broad Range | Preferred Range |
| --- | --- | --- |
| Phenolic Resin | 25–65 | 40–50 |
| Epoxy or Vinyl Compound | 15–50 | 25–35 |
| Melamine Resin | 5–35 | 1–20 |
| Photoinitiator | 1–15 | 2–10 |

In addition to the above components, other additives are commonly found in such compositions as described above. Such materials would not be present in minor concentration except for fillers and pigments which may be present in large concentration such as, for example, in amounts of from 5 to 30 percent by weight of the total of the dry components.

The dry components may be dispersed in a solvent to form a liquid coating composition. The concentration of the dry components in the solvent would depend on several factors such as the method of application to a substrate. For example, the concentration of the dry components in a slot coating composition would be significantly higher than in a curtain coating composition. In general, the concentration of the dry components in the solvent may vary from about 10 to 50 weight percent or more of the total weight of the coating composition. For example, for a curtain coating composition, the percentage may vary between about 40 and 45 percent of the total concentration, it being understood that the weight percentage of solids in the composition would be best determined by the viscosity required for the particular coating method used. If the composition is to be applied as a dry film, of course the dry film would be essentially free of solvent.

The coating composition of the invention is used in conventional manner provided that there is a step of thermal cure following development of an image. Using a method for forming a printed circuit board for purposes of exemplification, the photoimageable composition may be applied to a substrate having a pattern of conductive material disposed thereon. The substrate may be a copper laminate substrate prepared by the method described in the second chapter of "Printed Circuits Handbook" by Clyde F. Coombs, Jr., 2nd Edition, McGraw-Hill, 1979. Other suitable substrates include those prepared by laminating multilayer boards for the manufacture of printed circuit boards with vias (through-holes) and interconnections which may contain solder, as described in chapter twenty-three of the above reference, both incorporated herein by reference.

The photoimageable compositions may be coated onto the substrate using conventional techniques including screen printing, curtain coating, roller coating, slot coating, spin coating, flood coating, electrostatic spray, spray coating, dip coating, electrodeposition and as a dry film. The viscosity of the composition may be adjusted to meet the requirements for each method of application by adding additional solvent for methods requiring low viscosity or thickening agents and fillers for methods requiring high viscosity. The coating is deposited so as to yield a dry thickness of at least 0.50 mil on top of a trace as required by IPC Specification No. SM-840B and preferably in excess of 0.75 mil.

After coating, the layer of photoimageable composition is dried at 80°-100° C. for a total drying time of 20-60 minutes to remove solvent. During this drying step, it is desirable to avoid temperatures in excess of 100° C. and drying times of more than 60 minutes to prevent premature crosslinking of the composition. Premature crosslinking may result in difficulty in developing imaged areas.

The process of transferring a desired image to the photoimagable layer is well known in the art and involves exposing the layer to a source of activating radiation to initiate generation of acid in the exposed area. Suitable sources of activating radiation include actinic radiation, x-rays or lasers. The cationic photoinitiator initiates crosslinking of the phenolic and epoxy resin components but does not affect the melamine resin.

After exposure, the layer is subjected to a first cure or soft bake to initiate crosslinking. The soft bake conditions comprise heating to about 85°-100° C. for a period of time of between 10-20 minutes. During this step, some limited crosslinking of the melamine resin may occur if the process conditions are outside the temperature and time parameters. Slight variations in the time and temperature parameters may change depending upon the choice of melamine resin.

The area not exposed to activating radiation is developable in aqueous alkali solutions such as sodium hydroxide, sodium metasilicate, sodium carbonate, potassium hydroxide, potassium carbonate, ethylene diamine and the like. The preferred developer is a metal hydroxide with concentrations between 0.5-5% of alkaline hydroxide in water. The speed of development of the unexposed photoimageable composition from the surface of the panel is faster than other types of photoimageable compositions due to the presence of the melamine resin and the slightly less cohesive structure of the resist after the first crosslinking step. Since the melamine resin is in a substantially non-reactive state, it remains in a liquid form, thus attributing to the ease of removal of the unexposed photoimageable composition from the surface. It is highly unexpected that a crosslinking agent in an imageable composition would enhance developability of the coating. Typical development time from the surface is 30-60 seconds.

After development of the image, the photoimageable layer is characterized by a partial cure whereby mostly the phenolic resin and epoxy resin components are crosslinked leaving the board salvageable if any mistakes have been made. Should the board be found faulty, the layer is strippable using a sodium hydroxide solution or methylene chloride.

A second cure for the melamine resin component is necessary to achieve full thermal and electrical solder mask properties in the photoimageable composition layer. Crosslinking of the melamine resin is achieved by curing at a temperature of about 120°-160° C. for a period of time between about 20 and 60 minutes. The second cure hardens the melamine resin (and any other unreacted resins) and results in the unexpected properties of enhanced adhesion of the coating to the substrate together with excellent thermal and chemical resistance properties. Optionally, the layer may also be post cure exposed to UV light when certain types of epoxy or acrylate resins are present in the composition. The thus formed coating is now resistant to soldering and may also be used as a permanent dielectric coating.

In order to obtain a Class III—High Reliability solder mask (IPC SM840), there are a series of over 20 tests that a solder mask must pass under certain conditions. One of the toughest test is a procedure typically used by most manufacturers of solderable printed wire boards, wherein the solder is applied using hot air leveling (HAL). This process involves dipping the board, with the solder mask coating, into an aggressive water soluble flux followed by immersion in molten solder. The board is withdrawn from the solder, passed between air knives which are connected to a supply of hot compressed air to remove excess solder from the surface and holes in the board. Temperatures during this process are usually above 300° C. Solder mask used as permanent dielectric coatings must also be able to withstand the high temperatures of reflow.

Most prior art solder mask compositions have been formulated to pass the HAL test, but more stringent requirements must be met if the board is to be used for processes involving full build electroless copper plating. In full build electroless copper deposition procedures, the boards, covered with the solder mask, are subjected to sustained temperatures of about 60° C. for 14 hours in a highly alkaline environment (i.e. pH > 13).

It has been unexpectedly found that by adding a melamine resin to the formulation of the invention, the photoimageable composition of the present invention may be crosslinked using the distinctive two step process disclosed herein, resulting in both improved adhesion to the substrate and survival of the coating for extended periods in a highly alkaline copper plating bath. The following examples illustrate these unexpected results.

EXAMPLES 1 to 9

The following compositions were prepared by customary mixing procedures.

| Component | Example No. | | | | | | | | |
|---|---|---|---|---|---|---|---|---|---|
| | 1 | 2 | 3 | 4 | 5 | 6 | 7 | 8 | 9 |
| PVP | 45 | 40 | 50 | 50 | 40 | 45 | 50 | 50 | 40 |
| Epoxy | 55 | 60 | 50 | 50 | 45 | 40 | 35 | 35 | 45 |
| Melamine | 0 | 0 | 0 | 0 | 15 | 15 | 15 | 15 | 15 |
| P I | 4 | 8 | 8 | 6 | 6 | 8 | 4 | 8 | 4 |
| Solvent | S | Co | S | Co | Co | Co | Co | S | S |

In these examples, the phenolic resin is poly-(p-vinyl) phenol (PVP); the epoxy resin is a bisphenol A epoxy; the melamine is hexamethoxymethyl melamine; the photoinitiator (PI) is triphenylsulphonium tetrafluoroantimonate; and the solvents are 100% propylene glycol monomethyl ether acetate (S) or a cosolvent of 50% propylene glycol monomethyl ether acetate and 50% dipropylene glycol monomethyl ether acetate (Co).

Components of each formulation were mixed together as specified and additional optional components (i.e. dyes, sensitizer, wetting agent and filler) were added. The solvent was added to the solids in a one to one weight ratio. Precleaned copper clad laminate panels (12"×12") were then coated with each formulation using a draw down technique with a #65 Meyer rod and dried for 30 to 40 minutes at 95° C. The boards were then imagewise exposed using the standard IPC-B25 primary image artwork. After exposure, panels were subjected to a first crosslinking step by heating for about 15 minutes at 95° C. Panels were then developed using an aqueous solution of 15 percent sodium hydroxide. After development, panels were subjected to a second cure step by heating for 60 minutes at 140° C.

The boards coated with the photoimageable compositions were then tested for survival in an alkaline copper plating bath (pH>13) for periods of 7 hours on two consecutive days for a total of 14 hours exposure to the bath. The boards were evaluated based on three criteria: adhesion, halo or encroachment, and spots. The best indication of how well the board survived is by the number of squares which survived 14 hours in the alkaline copper plating bath without lifting from the copper substrate. Adhesion was measured by counting the squares below the pads on the IPC-B25 pattern. The best results are indicated by the highest number of squares remaining on the board after the test.

Halo or encroachment was measured at specific locations, indicated by four areas of the IPC pattern, around the edges of a developed image. Halo's are indicative of non-adhesion in those area and result in unsatisfactory electrical performance of the board. Each of the areas was measured for diameter of the halo and averaged. Because of the spacing between these four areas, a 15 mm encroachment was the worst score.

The boards were also visually examined for spots in the unimaged area of the panel. A 1"×1" template was placed on the film in 5 random locations, and the number of spots were averaged. Spots indicate lack of chemical resistance of the coating. Results are shown in the following table where adhesion is in pounds per linear inch:

TABLE 1

| Example No. | Adhesion | Halo | Spots |
|---|---|---|---|
| 1 | 7 | 15.0 | 0.8 |
| 2 | 0 | 15.0 | 0.3 |
| 3 | 2 | 11.0 | 0.3 |
| 4 | 2 | 13.8 | 1.8 |
| 5 | 21 | 1.5 | 2.0 |
| 6 | 21 | 3.3 | 1.0 |
| 7 | 21 | 1.8 | 4.5 |
| 8 | 21 | 1.9 | 3.8 |
| 9 | 21 | 4.3 | 3.0 |

Results show that the presence of melamine resin in Examples 5-9 significantly contributes to the number of squares that survive the 14 hour alkaline copper plating bath, and significantly reduces the size of the halo around developed areas. However, polyvinylphenol resins used in combination with melamine resins does not reduce the frequency of spots. For this reason, a novolak resin is the most preferred phenolic resin as shown in the following example.

EXAMPLES 10 to 18

The following novolak resin based compositions were prepared.

| Component | Example No. | | | | | | | | |
|---|---|---|---|---|---|---|---|---|---|
| | 10 | 11 | 12 | 13 | 14 | 15 | 16 | 17 | 18 |
| Novolak | 50 | 40 | 40 | 45 | 50 | 50 | 45 | 40 | 40 |
| Epoxy | 50 | 60 | 60 | 55 | 35 | 35 | 40 | 45 | 45 |
| Melamine | 0 | 0 | 0 | 0 | 15 | 15 | 15 | 15 | 15 |
| P I | 4 | 8 | 4 | 8 | 4 | 8 | 6 | 8 | 8 |
| Solvent | Co | S | S | Co | S | Co | Co | Co | S |

In this example, the preferred novolak is the condensation product of a p-cresol and formaldehyde; the epoxy resin is a bisphenol A epoxy; the melamine is hexamethoxymethyl melamine; the photoinitiator (PI) is triphenylsulfonium tetrafluoroantimonate; and the solvent types are 100% propylene glycol monomethyl ether acetate (S) and a cosolvent of 50% propylene glycol monomethyl ether acetate and 50% dipropylene glycol monomethyl ether acetate (Co).

Preparation, processing and evaluation were all in accordance with the procedures of Examples 1. The results are shown in the following table.

TABLE 2

| Example No. | Adhesion | Halo | Spots |
|---|---|---|---|
| 10 | 21 | 15.0 | 0.8 |
| 11 | 2 | 15.0 | 0.3 |
| 12 | 1 | 15.0 | 0.5 |
| 13 | 10 | 15.0 | 0.0 |
| 14 | 21 | 2.0 | 0.0 |
| 15 | 21 | 1.5 | 0.0 |
| 16 | 21 | 1.0 | 0.0 |
| 17 | 21 | 1.5 | 0.0 |
| 18 | 21 | 1.1 | 0.0 |

Results show that the presence of melamine resin in formulations 14 to 18 improves adhesion, significantly reduces the diameter of any halo and reduces the number of spots on the board.

EXAMPLE 19

The following example comprises the most preferred embodiment of the invention.

| | Parts by Weight |
|---|---|
| Mixed Cresol Novolak Resin | 45.0 |
| Bisphenol A/Epichlorhydrin Epoxy Resin | 30.0 |
| Triarylsulfonium hexafluroantimonate | 4.0 |
| Hexamethoxymethylmelamine | 15.0 |
| Filler (talc) | 35.00 |
| Additives such as dyes and photosensitizer | 3.5 |
| Propylene glycol methyl ether acetate - Dipropylene glycol methyl ether acetate mixed solvent | 100.00 |

While particular embodiments of the invention have been described in the above Examples, it will be understood that the invention is not limited thereto since various modifications may be made. It is therefore contemplated in the appended claims any such modifications as fall within the true spirit and scope of the invention.

We claim:

1. A method for forming an imaged dielectric layer adhesively bonded to metal conductors of a printed circuit board, said method comprising the steps of coating a photoimageable composition comprising an admixture of a phenolic resin, an acid activated cross linking agent, a cationic photoinitiator and a melamine thermal curing agent on said circuit board; exposing at least a portion of said layer of photoimageable composition to activating radiation; partially heat curing said layer; developing said layer by contact with an aqueous alkaline developer and thermally curing said layer to crosslink the same.

2. The method of claim 1 where the phenolic resin is a novolak resin, the acid activated crosslinking agent is an epoxy compound, the photoinitiator is an onium salt and the melamine curing agent is a melamine formaldehyde resin, each being present in a concentration expressed in parts by weight as follows:

| | |
|---|---|
| novolak resin | 25–65 |
| epoxy compound | 15–50 |
| melamine resin | 5–35 |
| onium salt | 1–15. |

3. The method of claim 2 where said components are present in the following amounts in parts by weight:

| | |
|---|---|
| novolak resin | 40–50 |
| epoxy compound | 25–35 |
| melamine resin | 1–20 |
| onium salt | 2–10. |

4. The method of claim 2 where said novolak resin is the product of a cresol formaldehyde condensation.

5. The method of claim 4 wherein said epoxy compound is the product of the reaction of Bisphenol A and epichlorohydrin.

6. The method of claim 2 where said melamine resin is an methylmelamine.

7. The method of claim 6 where said melamine resin is hexamethoxymethylmelamine.

8. The method of claim 7 where said melamine resin is an ether of hexamethoxymethylmelamine.

9. The method of claim 2 where said onium compound is a sulfonium compound.

10. The method of claim 2 where the photoimageable composition is applied as a liquid coating composition where the concentration of the solids in solution varies between about 10 and 50 percent by weight of the total composition.

11. The method of claim 10 where coating is by screen printing, curtain coating, roller coating, slot coating, spin coating, flood coating, spray coating, electrostatic spray coating, dip coating or electrodeposition.

* * * * *